(12) United States Patent
Oh et al.

(10) Patent No.: US 10,481,005 B2
(45) Date of Patent: Nov. 19, 2019

(54) SEMICONDUCTOR SUBSTRATE MEASURING APPARATUS AND PLASMA TREATMENT APPARATUS USING THE SAME

(71) Applicant: SAMSUNG ELECTRONICS CO., LTD., Suwon-si, Gyeonggi-Do (KR)

(72) Inventors: Se Jin Oh, Hwaseong-si (KR); Tae Kyun Kang, Hwaseong-si (KR); Yu Sin Kim, Hwaseong-si (KR); Jae Ik Kim, Hwaseong-si (KR); Chan Bin Mo, Hwaseong-si (KR); Doug Yong Sung, Seoul (KR); Seung Bin Ahn, Incheon (KR); Kul Inn, Seoul (KR); Yun Kwang Jeon, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/157,682

(22) Filed: Oct. 11, 2018

(65) Prior Publication Data

US 2019/0323893 A1 Oct. 24, 2019

(30) Foreign Application Priority Data

Apr. 20, 2018 (KR) .................. 10-2018-0046158

(51) Int. Cl.
*G01B 11/06* (2006.01)
*G01J 5/00* (2006.01)
(Continued)

(52) U.S. Cl.
CPC ........ *G01J 5/0007* (2013.01); *G01B 11/0675* (2013.01); *H01J 37/32724* (2013.01); *H01J 37/32972* (2013.01); *H01L 21/67248* (2013.01)

(58) Field of Classification Search
CPC .... G01J 5/0007; G01B 11/06; G01B 11/0658; G01B 11/0675; G01B 11/24; G01B 11/2441
See application file for complete search history.

(56) References Cited

U.S. PATENT DOCUMENTS

2001/0046052 A1 11/2001 Toida
2005/0271116 A1* 12/2005 Ito ...................... G01J 5/0003
                                                  374/120

(Continued)

FOREIGN PATENT DOCUMENTS

JP         11-258054        9/1999
JP         2005-072347      3/2005
(Continued)

*Primary Examiner* — Jonathan M Hansen
(74) *Attorney, Agent, or Firm* — F. Chau & Associates, LLC

(57) ABSTRACT

A semiconductor substrate measuring apparatus includes a light source unit generating irradiation light including light in a first wavelength band and light in a second wavelength band. An optical unit irradiates the irradiation light on a measurement object and condenses reflected light. A light splitting unit splits the reflected light, condensed in the optical unit, into a first optical path and a second optical path. A first detecting unit is disposed on the first optical path and detects first interference light in the first wavelength band in the reflected light. A second detecting unit is disposed on the second optical path and detects second interference light in the second wavelength band in the reflected light. A controlling unit calculates at least one of a surface shape or a thickness of the measurement object. The controlling unit calculates a temperature of the measurement object.

20 Claims, 6 Drawing Sheets

(51) Int. Cl.
  *H01L 21/67* (2006.01)
  *H01J 37/32* (2006.01)

(56) References Cited

U.S. PATENT DOCUMENTS

| | | | |
|---|---|---|---|
| 2006/0152734 A1* | 7/2006 | Suzuki | G01B 11/0675 |
| | | | 356/479 |
| 2008/0055583 A1 | 3/2008 | Lecomte et al. | |
| 2009/0051924 A1 | 2/2009 | Ito | |
| 2013/0059403 A1 | 3/2013 | Lee et al. | |
| 2019/0043768 A1 | 2/2019 | Oh et al. | |

FOREIGN PATENT DOCUMENTS

| | | |
|---|---|---|
| JP | 4220102 | 11/2008 |
| JP | 4739330 | 5/2011 |
| JP | 2015-153989 | 8/2015 |
| JP | 2016-209951 | 12/2016 |
| JP | 2017-044587 | 3/2017 |
| JP | 2017-164823 | 9/2017 |
| JP | 6232760 | 11/2017 |
| KR | 10-2019-0014693 | 2/2019 |

\* cited by examiner

SEMICONDUCTOR SUBSTRATE MEASURING APPARATUS AND PLASMA TREATMENT APPARATUS USING THE SAME

CROSS-REFERENCE TO RELATED APPLICATION

This application claims priority under 35 U.S.C. § 119 to Korean Patent Application No. 10-2018-0046158 filed on Apr. 20, 2018, in the Korean Intellectual Property Office, the disclosure of which is incorporated by reference herein in its entirety.

1. TECHNICAL FIELD

Exemplary embodiments of the present inventive concept relate to a semiconductor substrate measuring apparatus, and more particularly, to a plasma treatment apparatus using the same.

2. DISCUSSION OF RELATED ART

Generally, plasma is an ionized gas state including an ion, an electron, or a radical, and plasma is generated by subjecting a gas to a relatively high temperature, a relatively strong electric field or a relatively high frequency electromagnetic field.

A plasma treatment apparatus may be an apparatus for depositing a reactive material in a plasma state on a semiconductor substrate or, cleaning, ashing, or etching a semiconductor substrate using the reactive material in a plasma state. The plasma treatment apparatus may include a lower electrode installed within a chamber for mounting a substrate thereon, and an upper electrode installed in an upper part of a process chamber to face the lower electrode.

Recently, as process specificity in using plasma increases, the importance of technology measuring a state of the semiconductor substrate has been increasing, to precisely control a plasma treatment process. Therefore, research into technology for measuring the state of the semiconductor substrate during the plasma treatment process has been continued.

SUMMARY

An exemplary embodiment of the present inventive concept provides a semiconductor substrate measuring apparatus capable of simultaneously measuring a thickness, a surface shape and a temperature of a semiconductor substrate in a plasma treatment process. For example, a thickness, shape and temperature of a surface membrane of a semiconductor substrate may be simultaneously measure by a single integrally formed semiconductor substrate measuring apparatus according to an exemplary embodiment of the present invention.

An exemplary embodiment of the present inventive concept provides a plasma treatment apparatus in which measurement errors and deviations in measurement values obtained by measuring the state of the semiconductor substrate in the plasma treatment process are reduced.

According to an exemplary embodiment of the present inventive concept, a semiconductor substrate measuring apparatus includes a light source unit generating irradiation light including light in a first wavelength band and light in a second wavelength band. The second wavelength band has a longer wavelength than the first wavelength band. An optical unit irradiates the irradiation light on a measurement object and condenses reflected light. The reflected light is reflected from a surface of the measurement object. A light splitting unit splits the reflected light, condensed in the optical unit, into a first optical path and a second optical path. A first detecting unit is disposed on the first optical path and detects first interference light in the first wavelength band in the reflected light. A second detecting unit is disposed on the second optical path and detects second interference light in the second wavelength band in the reflected light. A controlling unit calculates at least one of a surface shape or a thickness of the measurement object, based on the first interference light. The controlling unit calculates a temperature of the measurement object, based on the second interference light.

According to an exemplary embodiment of the present inventive concept, a plasma treatment apparatus includes a process chamber having an internal space to process a semiconductor substrate by generating plasma. The process chamber has an observation window through which plasma emission light emitted by the plasma is transmitted externally. A light source unit generates irradiation light including light in a first wavelength band and light in a second wavelength band. The second wavelength band has a longer wavelength than the first wavelength band. An optical unit is positioned above the observation window to irradiate the irradiation light to the semiconductor substrate through the observation window. The optical unit condenses reflected light, reflected from the surface of the semiconductor substrate and measurement light having the plasma emission light. A light splitting unit splits the measurement light into a first optical path and a second optical path. A first detecting unit is disposed on the first optical path and detects first interference light in the first wavelength band in the measurement light. A second detecting unit is disposed on the second optical path and detects second interference light in the second wavelength band in the measurement light. A controlling unit calculates at least one of a thickness or a surface shape of a membrane formed on the surface of the semiconductor substrate, based on the first interference light. The controlling unit calculates a temperature of the semiconductor substrate based on the second interference light.

According to an exemplary embodiment of the present inventive concept, a plasma treatment apparatus includes a process chamber having an internal space to process a semiconductor substrate by generating plasma. The process chamber has an observation window. A light source unit is disposed outside of the process chamber. The light source unit generates irradiation light including light in a first wavelength band and in a second wavelength band, having a longer wavelength than the first wavelength band. An optical unit is positioned above the observation window to irradiate the irradiation light to the semiconductor substrate through the observation window. A light splitting unit splits the reflected light to a first optical path and a second optical path. A first detecting unit is disposed on the first optical path and detects first interference light in the first wavelength band in the reflected light. A second detecting unit is disposed on the second optical path and detects second interference light in the second wavelength band in the reflected light. A controlling unit calculates at least one of a thickness or a surface shape of a membrane formed on a surface of the semiconductor substrate, based on the first interference light. The controlling unit calculates a temperature of the semiconductor substrate based on the second interference light.

BRIEF DESCRIPTION OF DRAWINGS

The above and other features of the inventive concept will become more apparent by describing in detail exemplary embodiments thereof, with reference to the accompanying drawing, in which.

DETAILED DESCRIPTION

Figure 1:
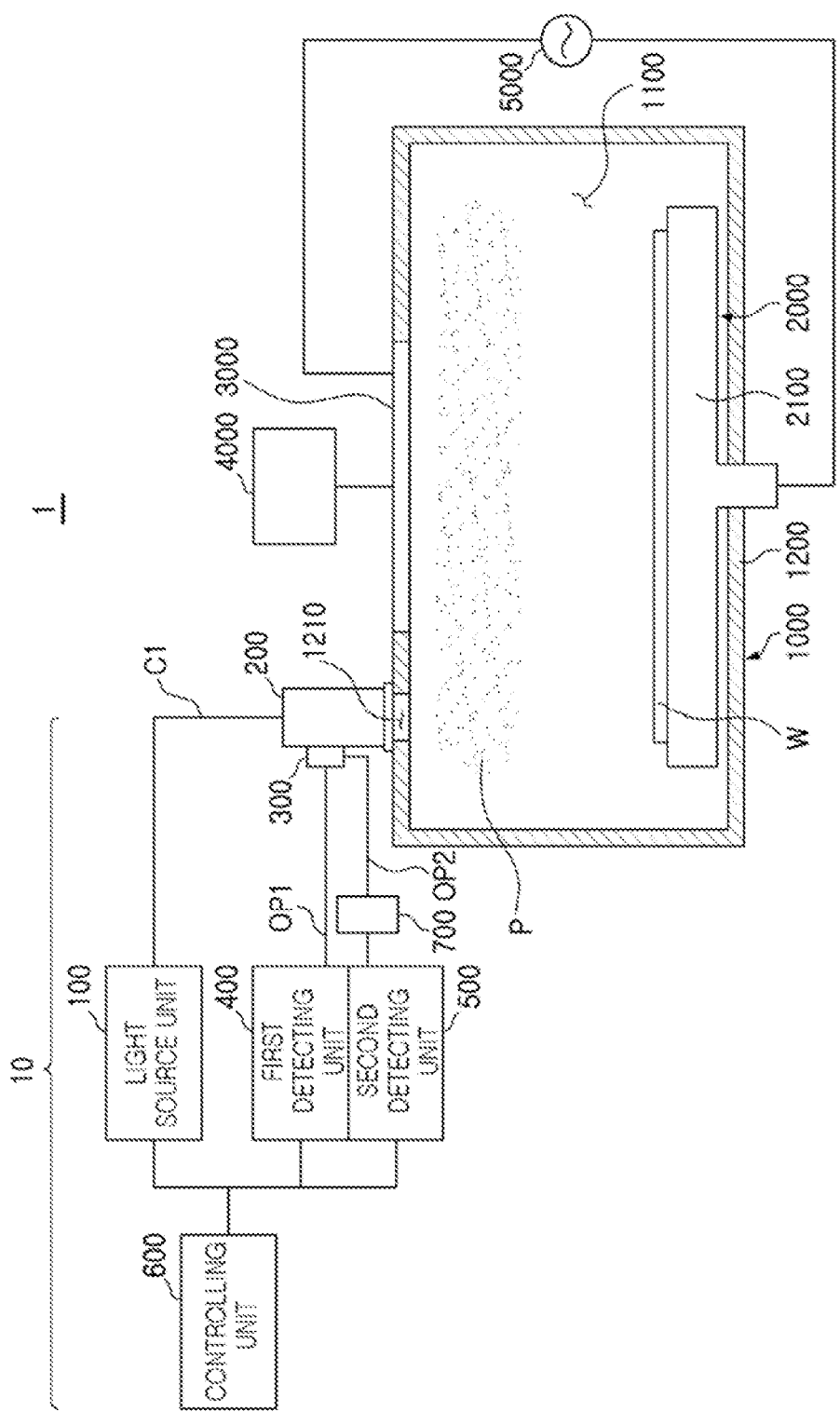
FIG. 1 is a schematic view of a plasma treatment apparatus according to an exemplary embodiment of the present inventive concept.

Exemplary embodiments of the present inventive concept will be described below in more detail with reference to the accompanying drawings. In this regard, the exemplary embodiments may have different forms and should not be construed as being limited to the exemplary embodiments of the present inventive concept described herein. Like reference numerals may refer to like elements throughout the specification and drawings.

A semiconductor substrate measuring apparatus 10 and a plasma treatment apparatus 1 according to an exemplary embodiment of the present inventive concept will be described in more detail below with reference to FIGS. 1 to 2.

FIG. 1 is a schematic view of a plasma treatment apparatus according to an exemplary embodiment of the present inventive concept. FIG. 2 is a view of an exemplary semiconductor substrate measuring apparatus of FIG. 1.

Referring to FIG. 1, a semiconductor substrate measuring apparatus 10 according to an exemplary embodiment of the present inventive concept may include a light source unit 100, an optical unit 200 positioned above an observation window 1210 of a process chamber 1000, a light splitting unit 300 splitting reflected light, condensed by the optical unit 200 to first and second optical paths OP1 and OP2, and first and second detecting units 400 and 500 detecting interference light from the reflected light. The optical unit 200 may be disposed on and may be attached to the observation window 1210.

According to an exemplary embodiment of the present inventive concept, the light source unit 100 may be positioned separately from the optical unit 200. However, exemplary embodiments of the present invention are not limited thereto. For example, the light source unit 100 and the optical unit 200 may be integrated single integrally formed unit according to an exemplary embodiment of the present inventive concept.

The plasma treatment apparatus 1, according to an exemplary embodiment of the present inventive concept, may be an apparatus for processing a semiconductor substrate such as a semiconductor wafer W, by using the semiconductor substrate measuring apparatus 10. While a case in which the plasma treatment apparatus 1 etches the semiconductor wafer W, such as the semiconductor substrate, is described in more detail below as an example, exemplary embodiments of the present inventive concept are not limited thereto. For example, the plasma treatment apparatus 1 may be applied to a process of cleaning or ashing the semiconductor substrate.

Referring to FIG. 1, the plasma treatment apparatus 1 may include a process chamber 1000 having a reactive space, a showerhead 3000 located in an upper part of the process chamber 1000, and a lower electrode 2000 disposed opposite the showerhead 3000. The plasma treatment apparatus 1 may further include a process gas supply unit 4000 and a power supply unit 5000, which are connected to the showerhead 3000.

The process chamber 1000 may include an internal space 1100 of a predetermined size as a reactive space to process the semiconductor wafer W by generating plasma. The process chamber 1000 may include a material having relatively high abrasion resistance and corrosion resistance. The process chamber 1000 may maintain the internal space 1100 in a closed or vacuum state in a plasma processing process, for example, in an etching process. An observation window 1210 (e.g., for observing a state of plasma P from the outside) may be disposed in an outer wall 1200 of the process chamber 1000. For example, the observation window 1210 may be positioned in an upper surface of the process chamber 1000 opposite the lower electrode 2000. The observation window 1210 may be positioned to overlap an outer edge of a semiconductor wafer W along a direction orthogonal to a bottom surface of the process chamber 1000. As an example, the observation window 1210 may be aligned with an outer edge of a support platform (e.g., a support platform including chuck 2100) along the direction orthogonal to the bottom surface of the process chamber 1000.

As the showerhead 3000 may be an apparatus distributing process gas inside the process chamber 1000, the process gas may be substantially evenly injected onto a surface of the semiconductor wafer W by the showerhead 3000. The showerhead 3000 may be connected to the power supply unit 5000 supplying a high frequency power to serve as an upper electrode.

The lower electrode 2000 may be disposed below the showerhead 3000 within the process chamber 1000. The lower electrode 2000, for example, may include a chuck 2100. The chuck 2100 may include aluminum. The semiconductor wafer W as a substrate to be processed may be disposed on an upper surface of the chuck 2100. In an exemplary embodiment of the present inventive concept, the chuck 2100 may be an electrical static chuck (ESC) capable of securing the semiconductor wafer W to the lower electrode with a force of static electricity.

The showerhead 3000 of the upper electrode and the lower electrode 2000 may be connected to the power supply unit 5000, and the plasma P forming form the process gas may be generated in a space between the showerhead 3000 and the lower electrode 2000.

The semiconductor substrate measuring apparatus 10 may include the light source unit 100, the optical unit 200, the light splitting unit 300, the first and second detecting units 400 and 500, and a controlling unit 600. The semiconductor substrate measuring apparatus 10 may irradiate light generated from the light source unit 100 to a surface of the semiconductor wafer W (e.g., the semiconductor wafer W may be referred to as a measurement object) within the process chamber 1000 through the optical unit 200. The optical unit 200 may condense reflected light, reflected from the surface of the semiconductor wafer W. The optical unit 200 may provide the reflected light being split by the light splitting unit 300 to the first and second detecting units 400 and 500. The light may be split by the light splitting unit 300 to be transmitted along separate optical paths OP1 and OP2 to the first and second detecting units 400 and 500, respectively. The first and second detecting units 400 and 500 may detect interference light included in the reflected light, and may provide the interference light to the controlling unit 600. For example, data regarding the interference light may be communicated to the controlling unit 600 by the first and second detecting units 400 and 500. The controlling unit 600 may detect a thickness and a surface shape of a membrane formed on a surface of the semiconductor wafer W and a temperature of the membrane, based on the interference light detected by the first and second detecting units 400 and 500, respectively. Therefore, the semiconductor substrate measuring apparatus 10 may measure the thickness and the surface shape of the membrane formed on the surface of the semiconductor wafer W and the temperature of the semiconductor wafer W simultaneously. Thus, the semiconductor substrate measuring apparatus 10 may simultaneously measure a thickness, a surface shape and a temperature of a semiconductor substrate (e.g. semiconductor wafer W) in a plasma treatment process. For example, a thickness, shape and temperature of a surface membrane of a semiconductor substrate may be simultaneously measure by a single integrally formed semiconductor substrate measuring apparatus 10 according to an exemplary embodiment of the present invention (e.g., without the use of multiple and separate measuring apparatuses). Thus, an occurrence of measurement errors may be reduced, and more accurate measurement results may be obtained (e.g., in a plasma treatment apparatus) by using the semiconductor substrate measuring apparatus 10 according to an exemplary embodiment of the present inventive concept. This measurement process will be described in more detail below.

The light source unit 100 may simultaneously provide light in a relatively wide wavelength band including light in a first wavelength band and in a second wavelength band. The light in the first wavelength band may be light having a wavelength band of from about 200 nm to about 900 nm, including ultraviolet light and visible light, and the light of the second wavelength band may be light having a wavelength band of from about 900 nm to 1800 nm, including near infrared light. In the light source unit 100, a xenon lamp, a tungsten halogen lamp, or a white light emitting diode may be employed. Therefore, the light source unit 100 may provide a light source for generating interference light in the first and second wavelength bands, which are respectively detected by the first and second detecting units 400 and 500. In an exemplary embodiment of the present inventive concept, the light source unit 100 will be described in more detail below by taking a case in which the xenon lamp providing light of 200 nm to 1800 nm is employed as an example.

The light generated from the light source unit 100 (which may be referred to herein as 'irradiation light') may be transmitted to the optical unit 200 through a first optical fiber C1. The optical unit 200 may irradiate irradiation light L1 transmitted from the light source unit 100 to the semiconductor wafer W, and may condense reflected light L2, reflected from a surface (e.g., an upper surface) of the semiconductor wafer W. The upper surface of the semiconductor wafer W may include a membrane Wa (see, e.g., FIG. 3), and the semiconductor substrate measuring apparatus 10 may simultaneously measure a thickness, a surface shape and a temperature of the membrane Wa.

Figure 2:
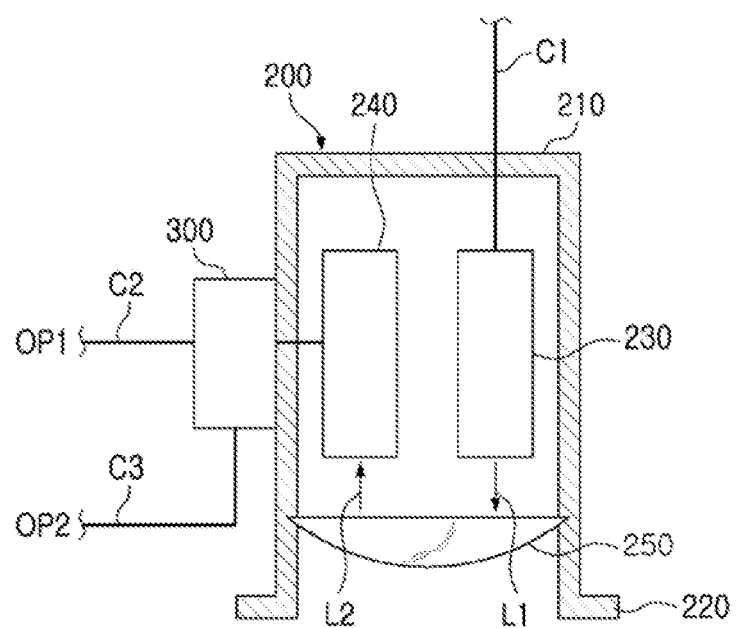
FIG. 2 is a view of an exemplary semiconductor substrate measuring apparatus of FIG. 1.

Referring to FIG. 2, the optical unit 200 may include a body unit 210. The body unit 210 may include a heat-resistant material. The body unit 210 may form an external shape of the optical unit 200. The body unit 210 need not be deformed even at a high temperature. The body unit 210 may prevent heat from being transferred to the internal space 1100 of the process chamber 1000.

A fixing unit 220 may be disposed at a front end of the optical unit 200, for example, in a direction in which the irradiation light L1 is irradiated, to be attached to the process chamber 1000. The fixing unit 220 may be fixed to the outer wall 1200 of the process chamber 1000 by a coupling member such as a bolt/nut and a screw.

A lens assembly 250 may be disposed at the front end of the optical unit 200. The lens assembly 250 may irradiate the irradiation light L1 and condense the reflected light L2 from the semiconductor wafer W. For example, the lens assembly 250 may include one lens, but may include a plurality of lenses according to an exemplary embodiment of the present inventive concept. For example, a condensing lens for condensing the reflected light L2 onto the optical unit 200 may be included, and a relatively wide-angle lens may be included such that the reflected light L2 is condensed at a relatively wide angle of view.

An irradiation unit 230 irradiating the irradiation light L1 and a light receiving unit 240 condensing the reflected light L2 may be disposed in an internal space of the body unit 210. The irradiation unit 230 may irradiate the irradiation light L1, transmitted through the optical fiber C1 to the front end of the optical unit 200 in which the lens assembly 250 is disposed. The light receiving unit 240 may condense the reflected light L2, reflected from the semiconductor wafer W. Not only the reflected light L2 but also the light emitted by the plasma P may be condensed in the light receiving unit 240. Thus, both the reflected light L2 and plasma emission light PL (described below in more detail with reference to FIG. 3) may pass through the lens assembly 250 and may be transmitted to the light receiving unit 240.

The light splitting unit 300 may split the reflected light L2, condensed in the optical unit 200 and may provide the reflected light, into the first and second optical paths OP1 and OP2. In an exemplary embodiment of the present inventive concept, the light splitting unit 300 may be a beam splitter including a translucent mirror. The light splitting unit 300 may divide light in the same wave length into the first and second optical paths OP1 and OP2 respectively including a second optical fiber C2 and a third optical fiber C3 by dividing luminous flux of the condensed reflected light L2. The second and third optical fibers C2 and C3 and the first optical fiber C1 may each include a plurality of optical fibers, and may each be provided in a form of a bundle of optical fibers.

Referring to FIG. 1, an optical amplifier 700 may be disposed on at least one of the first or second optical paths OP1 or OP2 to amplify the reflected light L2 provided to the first and/or second detecting units 400 and 500 disposed on the first and second optical paths OP1 and OP2, respectively.

The optical amplifier 700 may be disposed at an input terminal of the second detecting unit 500, and may selectively amplify a light amount of light transmitted to the second detecting unit 500 depending on the wavelength. The input terminal may refer to a point at which light transmitted along the second optical path OP2 is transmitted into the second detecting unit 500. Thus, the optical amplifier 700 may be coupled to a side surface of the second detecting unit 500. The optical amplifier 700 according to an exemplary embodiment of the present inventive concept may be a semiconductor optical amplifier (SOA).

In an exemplary embodiment of the present inventive concept, an error caused by the plasma P may be larger in an ultraviolet light wavelength range than in other wavelength ranges, and thus the optical amplifier 700 may be disposed only at the input terminal of the second detecting unit 500 according to an exemplary embodiment of the present inventive concept, but exemplary embodiments of the present invention are not limited thereto. For example, the optical amplifier 700 may be disposed at the input terminal of the first detecting unit 400. For example, the optical amplifier 700 may be positioned along an optical path transmitting light in an ultraviolet light wavelength range.

The optical amplifier 700 may selectively amplify a specific wavelength band of the reflected light L2 to increase measurement accuracy of the semiconductor substrate measuring apparatus 10. This will be described in more detail below with reference to FIGS. 3 to 6.

Figure 3:
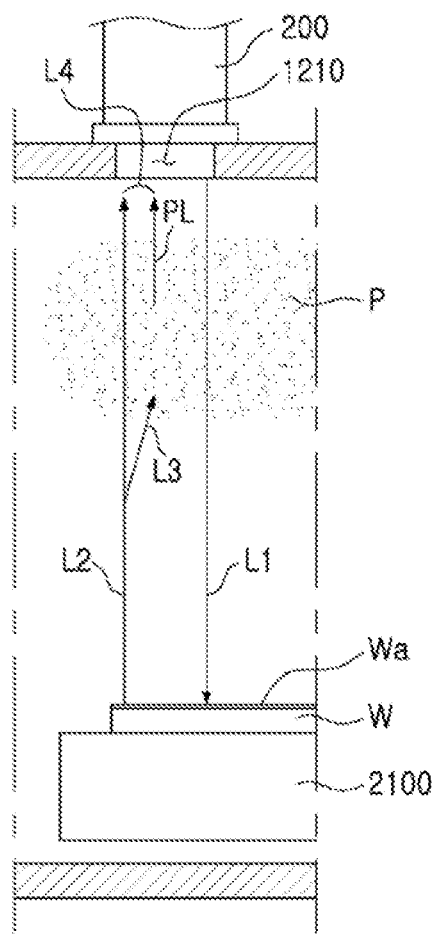
FIG. 3 is a view of an error of measurement light generated by plasma.
Figure 4:
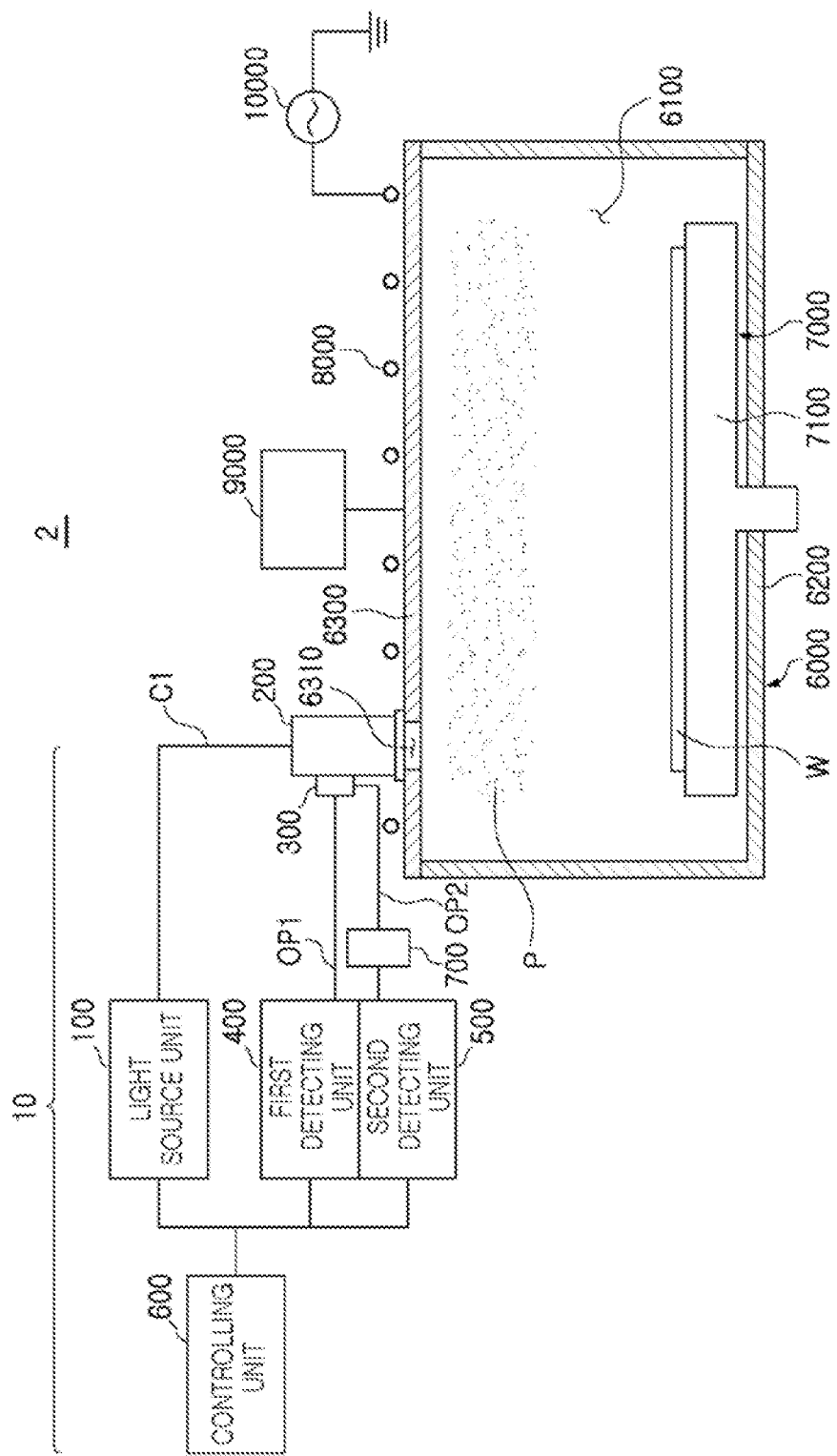
FIG. 4 is a schematic view of a plasma treatment apparatus according to an exemplary embodiment of the present inventive concept.
Figure 5:
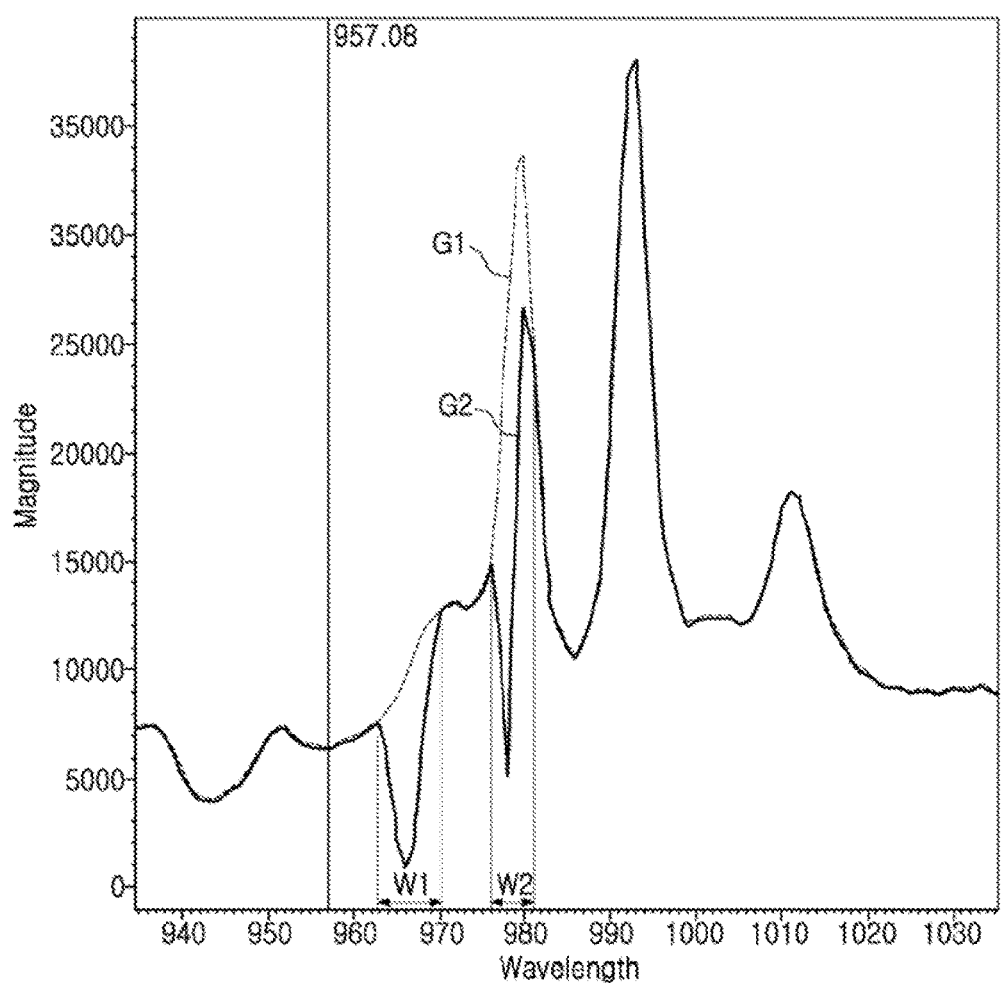
FIG. 5 is a graph of an exemplary comparison between irradiation light irradiated from an optical unit and reflected light.
Figure 6:
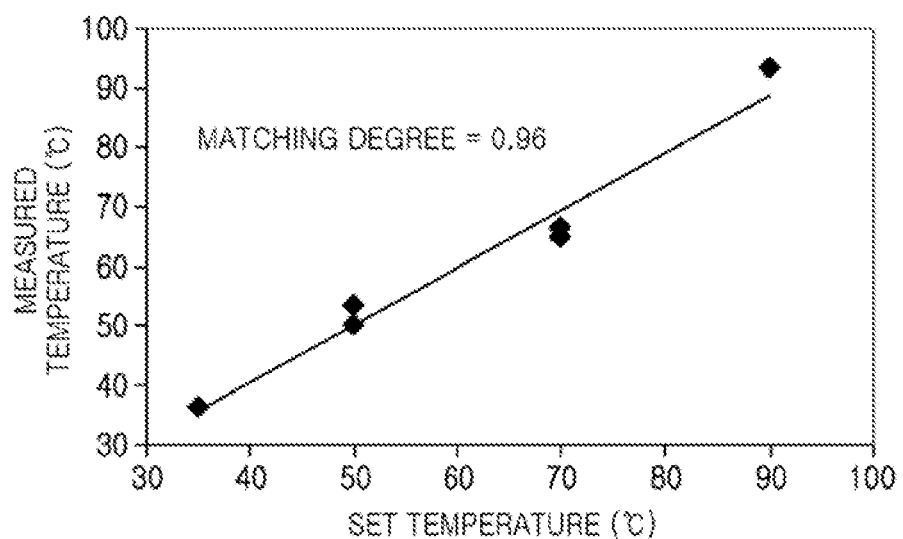
FIG. 6 is a graph illustrating an exemplary relationship between a set temperature of a chuck and an exemplary temperature measured by a semiconductor substrate measuring apparatus.

FIG. 3 is a view of an error of measurement light generated by plasma. FIG. 4 is a schematic view of a plasma treatment apparatus according to an exemplary embodiment of the present inventive concept. FIG. 5 is a graph comparing irradiation light irradiated from an optical unit and reflected light. FIG. 6 is a graph illustrating a relationship between a set temperature of a chuck and a temperature measured by a semiconductor substrate measuring apparatus.

Referring to FIG. 3, the irradiation light L1 irradiated from the optical unit 200 may be condensed after being reflected from the surface of the semiconductor wafer W, and interference light may be included in the reflected light since the wavelength changes during the reflection process. The semiconductor substrate measuring apparatus 10 may detect the surface shape and the temperature of the semiconductor wafer W by detecting the interference light. For example, when a membrane is formed on the surface of the semiconductor wafer W, the thickness and the surface shape of the membrane on the semiconductor wafer W may be detected.

However, light emitted by the plasma P (which may be referred to herein as "plasma emission light PL") in addition to the reflected light L2 may be incident on the optical unit 200 (e.g., the reflected light L2 and the plasma emission light PL may be collectively referred to herein as "measurement light L4"). As an example, a portion of the reflected light L2 (which may be referred to herein as "plasma absorbing light L3") may be absorbed by the plasma P such that the light condensed in the optical unit 200 is different from the reflected light L2.

Therefore, to reduce such a difference, a correction to remove the plasma emission light PL and the plasma absorbing light L3, which are influences of the plasma in the measurement light L4 may be employed. The correction may be performed by subtracting a spectrum of the plasma emission light PL from a spectrum of the measurement light L4 and adding a spectrum of the plasma absorbing light L3.

The spectrum of the plasma emission light PL may be measured by turning off the light source unit 100 in a state in which the plasma P is supplied to the process chamber 1000 and then detecting the measurement light L4. For example, the controlling unit 600 may detect the plasma emission light PL by turning off the light source unit 100 and measuring only the light emitted by the plasma P. Therefore, the measurement light L4 at this time is the same as the plasma emission light PL.

The spectrum of the plasma absorbing light L3 may be detected by subtracting the spectrum of the measurement light L4 and adding the spectrum of the plasma emission light PL, in the spectrum of the reflected light (which may be referred to herein as standard reflected light") measured by turning on the light source unit 100 in a state in which the plasma P is removed from the process chamber 1000. For example, the controlling unit 600 may detect the plasma absorbing light L3 by turning on the light source unit 100 to measure reflected light L2, subtracting the spectrum of the measurement light L4, and adding the spectrum of the plasma emission light PL.

FIG. 5 is a graph of an exemplary comparison between irradiation light irradiated from an optical unit and reflected light.

Referring to FIG. 5, a spectrum G1 of the reflected light (e.g., standard reflected light) is compared with a graph G2 obtained by subtracting the spectrum of the plasma emission light PL from the spectrum of the measurement light. While G1 and G2 may be generally similar, G1 may be a larger value than G2 in W1 and W2 areas. The difference between the areas W1 and W2 corresponds to the plasma absorbing light L3 and a portion of the reflected light L2 is absorbed in the plasma P and an area in which a peak of the wavelength is attenuated is generated. Accordingly, when the optical amplifier 700 amplifies the wavelengths in the W1 and W2 areas and compensates the attenuated peak to be equal to G1, an influence by the plasma absorbing light L3 in the measurement light may be removed.

Therefore, an error caused by the plasma P in the measurement light may be removed by disposing the optical amplifier 700 set to detect the plasma emission light PL and amplify W1 and W2 areas of the measurement light, through a process of turning the light source unit 100 on or off.

FIG. 6 is a graph illustrating an exemplary relationship between a set temperature of a chuck and an exemplary temperature measured by a semiconductor substrate measuring apparatus.

Referring to FIG. 6, an exemplary relationship between a set temperature in the chuck 2100 and an exemplary temperature measured in the semiconductor substrate measuring apparatus 10 is illustrated. A matching degree between the set temperature by the chuck 2100 and the temperature measured by the semiconductor substrate measuring apparatus 10 may be about 0.96 and thus the temperature measured by the semiconductor substrate measuring apparatus 10 may have a very high accuracy.

The first and second detecting units 400 and 500 may detect interference light in the reflected light L2 provided to the first and second optical paths OP1 and OP2 to generate the first and second measurement data and may transmit the first and second measurement data which are converted into electrical signals to the controlling unit 600. The first and second detecting units 400 and 500 may be spectrometers for detecting interference light in the first and second wavelength bands, respectively. In addition, the first detecting unit 400 may include a Si photodiode charge coupled device (CCD) as a sensor for detecting ultraviolet light or interference light in a visible light wavelength band and the second detecting unit 500 may include an InGaAs photodiode charge coupled device (CCD) as a sensor for detecting interference light in a near-infrared light wavelength band. Alternatively, the second detecting unit 500 may include a Si photodiode charge coupled device (CCD) as a sensor for detecting ultraviolet light or interference light in a visible light wavelength band and the first detecting unit 400 may include an InGaAs photodiode charge coupled device (CCD) as a sensor for detecting interference light in a near-infrared light wavelength band.

The controlling unit 600 may calculate the surface shape and/or thickness of the semiconductor wafer W, based on a first measurement data transmitted from the first detecting unit 400, and may calculate the temperature of the semiconductor wafer W, based on a second measurement data transmitted from the second detecting unit 500. Alternatively, the controlling unit 600 may calculate the surface shape and/or thickness of the semiconductor wafer W, based on a second measurement data transmitted from the second detecting unit 500, and may calculate the temperature of the semiconductor wafer W, based on a first measurement data transmitted from the first detecting unit 400. For example, the optical paths of light OP1 and OP2 may be reversed.

FIG. 4 is a schematic view of a plasma treatment apparatus according to an exemplary embodiment of the present inventive concept.

A plasma treatment apparatus 2 described below with reference to FIG. 4 may include substantially the same semiconductor substrate measuring apparatus 10 as described above, and thus duplicative descriptions may be omitted below.

Referring to FIG. 4, the plasma treatment apparatus 2 may include a process chamber 6000 having an internal space 6100 of a predetermined size as a reactive space, a window plate 6300 and an ICP antenna 8000 located in an upper part of the process chamber 6000, and a support member 7000 disposed opposite to the window plate 6300. The support member 7000 may include a chuck 7100. The chuck 7100 may include aluminum. The plasma treatment apparatus 2 may further include a process gas supply unit 9000, which may be connected to a showerhead (e.g., showerhead 3000 described above in more detail), and a power supply unit 10000 applying power to the ICP antenna 8000. An observation window 6310 for observing the state of the plasma P externally may be disposed on an outer wall 6200 of the process chamber 6000. The observation window 6310 may penetrate the window plate 6300.

The ICP antenna 8000 may be connected to the power supply unit 10000 to form an electromagnetic field in the internal space 6100 of the process chamber 6000. The window plate 6300 may be disposed on the upper part of the process chamber 6000 and may seal the internal space 6100 of the process chamber 6000.

As set forth above, according to an exemplary embodiment of the present inventive concept, a semiconductor substrate measuring apparatus and a plasma treatment apparatus using the same may simultaneously measure a thickness and a surface shape of a membrane on a semiconductor substrate and a temperature of the semiconductor substrate in a plasma treatment process.

While the present inventive concept has been shown and described with reference to the exemplary embodiments thereof, it will be apparent to those of ordinary skill in the art that various changes in form and detail may be made thereto without departing from the spirit and scope of the present inventive concept.

What is claimed is:

1. A semiconductor substrate measuring apparatus, comprising:
    a light source unit generating irradiation light including light in a first wavelength band and light in a second wavelength band, having a longer wavelength than the first wavelength band;
    an optical unit irradiating the irradiation light on a measurement object and condensing reflected light, reflected from a surface of the measurement object;
    a light splitting unit splitting the reflected light, condensed in the optical unit, into a first optical path and a second optical path;
    a first detecting unit disposed on the first optical path and detecting first interference light in the first wavelength band in the reflected light;
    a second detecting unit disposed on the second optical path and detecting second interference light in the second wavelength band in the reflected light; and
    a controlling unit calculating at least one of a surface shape or a thickness of the measurement object, based on the first interference light and calculating a temperature of the measurement object, based on the second interference light.

2. The semiconductor substrate measuring apparatus according to claim 1, wherein at least one of the first and second detecting units further comprises an optical amplifier selectively amplifying the reflected light along the second optical path.

3. The semiconductor substrate measuring apparatus according to claim 2, wherein the optical amplifier is a semiconductor optical amplifier.

4. The semiconductor substrate measuring apparatus according to claim 1, wherein the first detecting unit comprises a Si photodiode charge coupled device (CCD), and the second detecting unit comprises an InGaAs photodiode charge coupled device (CCD).

5. The semiconductor substrate measuring apparatus according to claim 1, wherein the light in the first wavelength band is light in a wavelength band of ultraviolet light to visible light and the light in the second wavelength band is light in a near-infrared band.

6. The semiconductor substrate measuring apparatus according to claim 5, wherein the light source unit comprises a xenon lamp emitting light in the first and second wavelength bands.

7. A plasma treatment apparatus, comprising:
    a process chamber having an internal space to process a semiconductor substrate by generating plasma, the process chamber having an observation window through which plasma emission light emitted by the plasma is transmitted externally;
    a light source unit generating irradiation light including light in a first wavelength band and light in a second wavelength band, having a longer wavelength than the first wavelength band;
    an optical unit positioned above the observation window to irradiate the irradiation light to the semiconductor substrate through the observation window, and condensing reflected light, reflected from a surface of the semiconductor substrate and measurement light having the plasma emission light;
    a light splitting unit splitting the measurement light into a first optical path and a second optical path;
    a first detecting unit disposed on the first optical path and detecting first interference light in the first wavelength band in the measurement light;
    a second detecting unit disposed on the second optical path and detecting second interference light in the second wavelength band in the measurement light; and
    a controlling unit calculating at least one of a thickness or a surface shape of a membrane formed on the surface of the semiconductor substrate, based on the first interference light and calculating a temperature of the semiconductor substrate based on the second interference light.

8. The plasma treatment apparatus according to claim 7, wherein at least one of the first and second detecting units further comprises an optical amplifier selectively amplifying the reflected light at an input terminal depending on a wavelength of the reflected light.

9. The plasma treatment apparatus according to claim 8, wherein the controlling unit measures the plasma emission light condensed in the optical unit in a state in which the light source unit is turned off, and the plasma is generated in the process chamber.

10. The plasma treatment apparatus according to claim 9, wherein the controlling unit measures standard reflected light condensed in the optical unit in a state in which the light source unit is turned on, and the plasma is removed from the process chamber, subtracts a spectrum of the measurement light from the spectrum of the standard reflected light, and adds the spectrum of the plasma emission light to generate light having a corrected spectrum.

11. The plasma treatment apparatus according to claim 8, wherein the optical amplifier is a semiconductor optical amplifier.

12. The plasma treatment apparatus according to claim 7, wherein the light source unit and the optical unit are a single integrated unit.

13. The plasma treatment apparatus according to claim 7, wherein the first detecting unit comprises a Si charge coupled device (CCD), and the second detecting unit comprises an InGaAs photodiode charge coupled device (CCD).

14. The plasma treatment apparatus according to claim 7, wherein the light in the first wavelength band is light in a wavelength band of ultraviolet light to visible light and the light in the second wavelength band is light in a near-infrared band.

15. The plasma treatment apparatus according to claim 7, wherein the light source unit comprises a xenon lamp emitting light in the first and second wavelength bands, and the controlling unit turns the xenon lamp on or off.

16. A plasma treatment apparatus, comprising:
a process chamber having an internal space to process a semiconductor substrate by generating plasma, the process chamber having an observation window;
a light source unit disposed outside of the process chamber, generating irradiation light including light in a first wavelength band and a second wavelength band, having a longer wavelength than the first wavelength band;
an optical unit positioned above the observation window to irradiate the irradiation light to the semiconductor substrate through the observation window;
a light splitting unit splitting the reflected light to a first optical path and a second optical path;
a first detecting unit disposed on the first optical path and detecting first interference light in the first wavelength band in the reflected light;
a second detecting unit disposed on the second optical path and detecting second interference light in the second wavelength band in the reflected light; and
a controlling unit calculating at least one of a thickness or a surface shape of a membrane formed on a surface of the semiconductor substrate, based on the first interference light and calculating a temperature of the semiconductor substrate based on the second interference light.

17. The plasma treatment apparatus according to claim 16, wherein at least one of the first or second detecting units further comprises an optical amplifier selectively amplifying the reflected light depending on a wavelength of the reflected light.

18. The plasma treatment apparatus according to claim 16, wherein the light in the first wavelength band is light in a wavelength band of ultraviolet to visible light and the light in the second wavelength band is light in a near-infrared wavelength band.

19. The plasma treatment apparatus according to claim 16, wherein the light source unit comprises a xenon lamp emitting light in the first and second wavelength bands, and the controlling unit controls turning on or turning off of the xenon lamp.

20. The plasma treatment apparatus according to claim 19, wherein the light source unit and the optical unit are a single integrated unit.

* * * * *